United States Patent
Katsumata et al.

(10) Patent No.: US 10,020,242 B2
(45) Date of Patent: Jul. 10, 2018

(54) IMMERSION COOLING ARRANGEMENTS FOR ELECTRONIC DEVICES

(71) Applicant: Hamilton Sundstrand Corporation, Charlotte, NC (US)

(72) Inventors: Shin Katsumata, Rockford, IL (US); Charles Shepard, DeKalb, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/098,810

(22) Filed: Apr. 14, 2016

(65) Prior Publication Data
US 2017/0303434 A1  Oct. 19, 2017

(51) Int. Cl.
| | | |
|---|---|---|
| *H01L 23/44* | (2006.01) | |
| *H05K 7/20* | (2006.01) | |
| *H01L 23/473* | (2006.01) | |
| *H05K 1/02* | (2006.01) | |

(52) U.S. Cl.
CPC ......... *H01L 23/44* (2013.01); *H05K 7/20327* (2013.01); *H01L 23/473* (2013.01); *H05K 1/0203* (2013.01); *H05K 7/20236* (2013.01); *H05K 7/20881* (2013.01)

(58) Field of Classification Search
CPC .......... H05K 7/20236; H05K 7/20927; H05K 7/20936; H05K 7/203; H05K 1/0201–1/0212; H01L 23/473; H01L 23/44
USPC ................................. 361/699, 700
See application file for complete search history.

(56) References Cited

U.S. PATENT DOCUMENTS

| | | | |
|---|---|---|---|
| 3,200,881 A | | 8/1965 | Bucks et al. |
| 4,590,538 A | | 5/1986 | Cray, Jr. |
| 5,131,233 A | | 7/1992 | Cray et al. |
| 5,763,951 A | * | 6/1998 | Hamilton .............. H01L 23/473 257/706 |
| 6,124,632 A | * | 9/2000 | Lo .......................... G01F 1/6845 257/678 |
| 7,215,547 B2 | * | 5/2007 | Chang .................. H05K 1/0272 165/104.33 |
| 7,294,926 B2 | * | 11/2007 | Schubert ............... H01L 23/473 257/714 |
| 7,307,841 B2 | * | 12/2007 | Berlin ..................... H01L 23/44 165/80.4 |
| 7,957,145 B2 | * | 6/2011 | Suzuki ............... H05K 7/20936 165/104.33 |
| 8,014,150 B2 | | 9/2011 | Campbell et al. |
| 8,094,454 B2 | | 1/2012 | Lowry |
| 8,184,436 B2 | | 5/2012 | Campbell et al. |

(Continued)

FOREIGN PATENT DOCUMENTS

WO   WO-2017091862 A1   6/2017

OTHER PUBLICATIONS

Extended European Search Report from the European Patent Office dated Sep. 20, 2017 for Application No. 17165077.3.

*Primary Examiner* — Zachary M Pape
(74) *Attorney, Agent, or Firm* — Locke Lord LLP; Scott D. Wofsy; Christopher J. Cillié

(57) ABSTRACT

An electronics cooling arrangement includes a housing configured to contain a coolant and an electronic device disposed within the housing. The electronic device has a passageway with at least one inlet and at least one outlet and is configured to allow fluid flowing between the inlet and the outlet to cool the electronic device.

14 Claims, 3 Drawing Sheets

(56) References Cited

U.S. PATENT DOCUMENTS

| | | | |
|---|---|---|---|
| 8,194,406 B2* | 6/2012 | Campbell | H05K 7/20827 165/104.33 |
| 8,726,976 B2 | 5/2014 | Schrader et al. | |
| 8,806,749 B2* | 8/2014 | Campbell | H05K 13/00 165/104.21 |
| 8,964,391 B2 | 2/2015 | Campbell et al. | |
| 8,966,922 B2 | 3/2015 | Campbell et al. | |
| 9,042,099 B2 | 5/2015 | Campbell et al. | |
| 9,157,687 B2 | 10/2015 | Schon | |
| 9,210,830 B2 | 12/2015 | Campbell et al. | |
| 9,250,024 B2 | 2/2016 | Campbell et al. | |
| 9,622,376 B2* | 4/2017 | Mathew | H05K 7/20236 |
| 2007/0023169 A1* | 2/2007 | Mahalingam | F25D 17/02 165/104.28 |
| 2009/0207568 A1* | 8/2009 | Haveri | H01L 23/473 361/699 |
| 2011/0049976 A1 | 3/2011 | Suzuki et al. | |

* cited by examiner

IMMERSION COOLING ARRANGEMENTS FOR ELECTRONIC DEVICES

FEDERAL RESEARCH STATEMENT

This invention was made with government support with the National Security Agency under Contract No. H98230-13-C-1037. The government has certain rights in the invention.

BACKGROUND OF THE INVENTION

1. Field of the Invention

The present disclosure relates to electrical systems, and more particularly to heat removal from electronic devices using immersion cooling.

2. Description of Related Art

Vehicular electrical systems, such as aircraft electrical systems, commonly include power-consuming electronic devices like battery charging modules, power converters, and motor controllers. Electrical power applied to such electronic devices generates heat, generally from resistive heating of current-carrying components like windings, conductive traces, and power electronics. In some electrical systems the heat generated can require cooling provisioning selected according to the amount of heat generated by the electronic device during operation, examples of common cooling provisioning including conduction cooling, natural convection cooling, radiation cooling, forced-air cooling, and liquid cooling.

As the power density of electronic devices increases from parts becoming smaller and/or increased speed, heat removal through liquid cooling has received attention. Liquid cooling generally entails coupling a coolant source to an electronic device through input and return conduits, coolant typically flowing to and from the coolant source in a closed loop arrangement to cool the electronic device. The input and return conduits typically require sealing at the electronic device to retain the coolant in the closed loop coolant circuit.

Such conventional methods and systems have generally been considered satisfactory for their intended purpose. However, there is still a need in the art for improved electronic device cooling arrangements and methods of cooling electronic devices. The present disclosure provides a solution for this need.

SUMMARY OF THE INVENTION

An electronics cooling arrangement includes a housing configured to contain a coolant and an electronic device disposed within the housing. The electronic device has a passageway with at least one inlet and at least one outlet and is configured to allow fluid flowing between the inlet and the outlet to cool the electronic device.

In certain embodiments, the housing can be a sealed housing. The coolant can include a dielectric coolant, such as a fluorocarbon. The electronic component can be submerged within the dielectric coolant. The electronic component can be disposed within the housing in an immersion cooling arrangement. A pump can be fluid communication with the passageway of the electronic device through the inlet or the outlet. The pump can be contained within the housing. The pump can be submerged within the coolant. The pump can be configured to urge coolant through the passageway. A control module can be operatively connected to the pump to urge fluid through the passageway according to heat generation by the electronic device.

In accordance with certain embodiments, the electronic device can define at least one of the inlet, the passageway, and the outlet. One or more of the inlet, the passageway, and the outlet can be submerged within the coolant. A hypodermic needle segment can fluidly couple the inlet with passageway of the electronic device. The inlet and the outlet can be in fluid communication with one another through the housing and externally to the passageway.

It is also contemplated that, in accordance with certain embodiments, a vent or small channel can be in fluid communication with the passageway. The vent or small channel can be disposed fluidly between the inlet and the passageway. A plenum can be defined within the electronic device fluidly connected between the inlet and the vent or small channel. The electronic device can include an integrated circuit exposed to an interior of the housing. The electronic device includes an integrated circuit bounding the passageway.

An immersion cooling arrangement includes a sealed housing, a dielectric coolant disposed within the housing, and an electronic device disposed within the housing. The electronic device has a passageway with at least one inlet and at least one outlet. The inlet is submerged within the dielectric coolant, the outlet is submerged within the dielectric coolant, and the inlet and the outlet are in fluid communication with one another externally of the passageway through an interior of the sealed housing.

A method of cooling an electronic device includes introducing fluid from an interior of a housing into a passageway defined by the electronic device, flowing fluid through the passageway, and transferring heat from the electronic device to the fluid flowing through the passageway. In certain embodiments, the method can include generating heat using an electronic device disposed within the housing. The method can include flowing heated coolant from the passageway into the interior of the housing. The method can include pumping coolant through the passageway.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
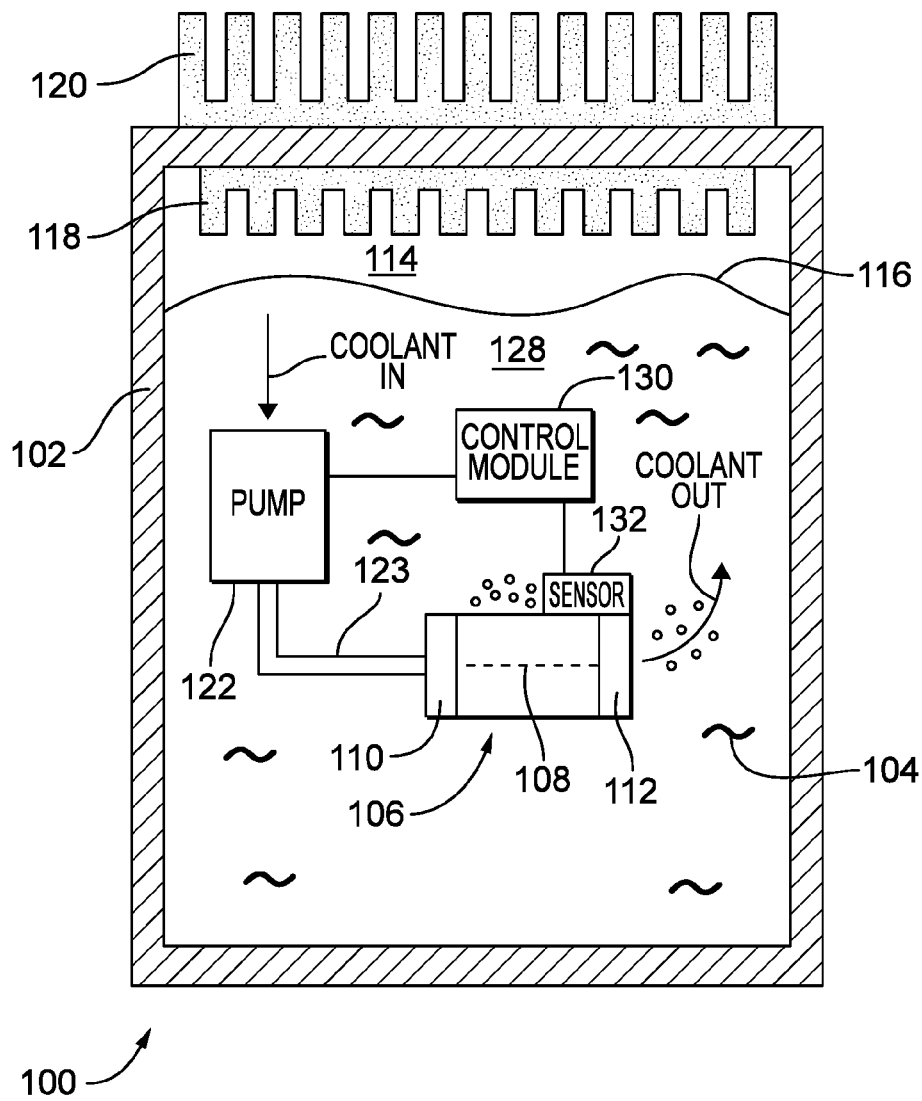
FIG. 1 is a schematic view of an exemplary embodiment of an immersion cooled electronics arrangement constructed in accordance with the present disclosure, showing an electronics cooling arrangement including an electronic device submerged in coolant within a sealed housing.

Reference will now be made to the drawings wherein like reference numerals identify similar structural features or aspects of the subject disclosure. For purposes of explanation and illustration, and not limitation, a partial view of an exemplary embodiment of an immersion cooled electronic arrangement in accordance with the disclosure is shown in FIG. 1 and is designated generally by reference character 100. Other embodiments of immersion cooled electronic assemblies in accordance with the disclosure, or aspects thereof, are provided in FIGS. 2 and 3, as will be described. The systems and methods described herein can be used for cooling electronic devices in aircraft electrical systems like motor controllers, though the present disclosure is not limited to motor controllers or to aircraft electrical systems in general.

Referring to FIG. 1, electronics cooling arrangement 100 is shown. Electronics cooling arrangement 100 includes a housing 102 configured to contain a fluid 104, also referred to herein as coolant, and an electronic device 106 disposed within housing 102. Electronic device 106 has a passageway 108 with at least one inlet 110 and at least one outlet 112, and is configured to allow fluid, e.g. coolant 104, flowing between inlet 110 and outlet 112 to cool electronic device 106. It is contemplated that housing 102 be sealed with respect to the external environment. Coolant 104 is sealably contained within housing 102. It is contemplated that coolant 104 may be hermetically sealed within housing 102.

Coolant 104 may include dielectric coolant. Coolant 104 may be a thermally conductive, fluorocarbon-based coolant. Examples of suitable dielectric materials include perfluorohexane (FC-72), perfluoro (FC-75), and/or perfluorotripentylamine (FC-70). FC-72, FC-75, and FC-70 are available under the trade name Flourinert® from the 3M Company of Maplewood, Minn.

Coolant 104 includes vapor phase coolant and liquid phase coolant. Vapor phase coolant occupies an ullage space 114 defined in an upper portion (relative to gravity) of housing 102. Liquid phase coolant occupies a lower portion (relative to the direction of gravity) of housing 102. A liquid surface 116 separates liquid phase coolant from vapor phase coolant, bounding ullage space 114. As will be appreciated by those of skill in the art, coolant 104 has vapor state to liquid state ratio according to an amount of liquid state coolant evaporated into vapor state coolant from heat transferred into coolant 104.

A condenser 118 is disposed within ullage space 114. A heat exchanger 120 is disposed externally of housing 102 and is thermal communication with condenser 118 such that vapor phase coolant from electronic device 106 comes into contact with condenser 118, cools by transferring heat to heat exchanger 120 through condenser 118 such that vapor phase coolant returns to liquid phase, and returns to the lower portion of housing 102. In the illustrated exemplary embodiment condenser 118 is fixed against interior surface opposite heat exchanger 120. Both condenser 118 and heat exchanger 120 include one or more fins to increase surface area to facilitate heat transfer between condenser 118 and heat exchanger 120.

In the illustrated exemplary embodiment, electronic device 106 is disposed within housing 102 and submerged within coolant 104. In this respect electronic device 106 is submerged within coolant 104 such that coolant 104 boils off hot components of electronic device 106. The boiled coolant travels to condenser 118 wherein it condenses into a liquid form by transferring heat to condenser 118 and heat exchanger 120. It is contemplated that electronic device 106 can be disposed within housing 102 is an immersion cooling arrangement. It is also contemplated that one or more of inlet 110, passageway 108, and outlet 112 can be submerged within coolant 104. In contemplated embodiments, outlet 112 may open directly into ullage space 114, a portion of electronic device 106 being disposed above liquid surface 116.

In embodiments an optional pump 122 is in fluid communication with passageway 108. Pump 122 disposed within an interior of housing 102 and is in fluid communication with passageway 108. In the illustrated exemplary embodiment, pump 122 is submerged within coolant 104 and is in fluid communication with inlet 110, which is in turn discharged into interior 128 of housing 102 after traversing passageway 108. A supply conduit 123 fluidly connects pump 122 to inlet 110, pump 122 thereby being arranged to provide a flow of pressurized coolant to passageway 108. This allows coolant to be pumped from submerged pump 122 into passageway 108, which may include a microchannel cooler, and thereafter be discharged into interior 128 of housing 102 after traversing the microchannel cooler. In certain embodiments pump 122 is connected by supply conduit 123 to outlet 112, pump 122 thereby being arranged to draw heated coolant from passageway 108.

A control module 130 can be operatively connected with pump 122. The control module 130 can be communicative with a sensor 132 disposed within housing 102 and can be configured to selectively operate pump 122 according to the need to provide additional coolant to electronic device 106. In the illustrated exemplary embodiment sensor 132 is a temperature transducer that is thermally communicative with electronic device 106, such as by being affixed to electronic device 106. This can improve efficiency, coolant being forced through passageway 108 only when operation of electronic device 106 requires additional cooling, improving efficiency of electronics cooling arrangement 100.

In embodiments that do not employ the pump 122, the passageway 108 can be oriented vertically relative to the direction of gravity such that fluid flow through the passageway 108 is induced by heat rise of the fluid from the electronic device 106. Increases in heat of the fluid cause a reduction in density of the fluid causing it to rise through the passageway 108 and to exit the outlet 112 into the interior 128 of the housing 102. This movement of fluid causes a decrease in pressure within the passageway 108 that draws fluid from the interior 128 of the housing 102 via the inlet 110 into the passageway 108. In certain embodiments, passageway 108 can be in fluid communication with pump 122 and be oriented vertically, thereby reducing the amount of power required by pump 122 due to the tendency of heated fluid to rise in passageway 108.

Figure 2:
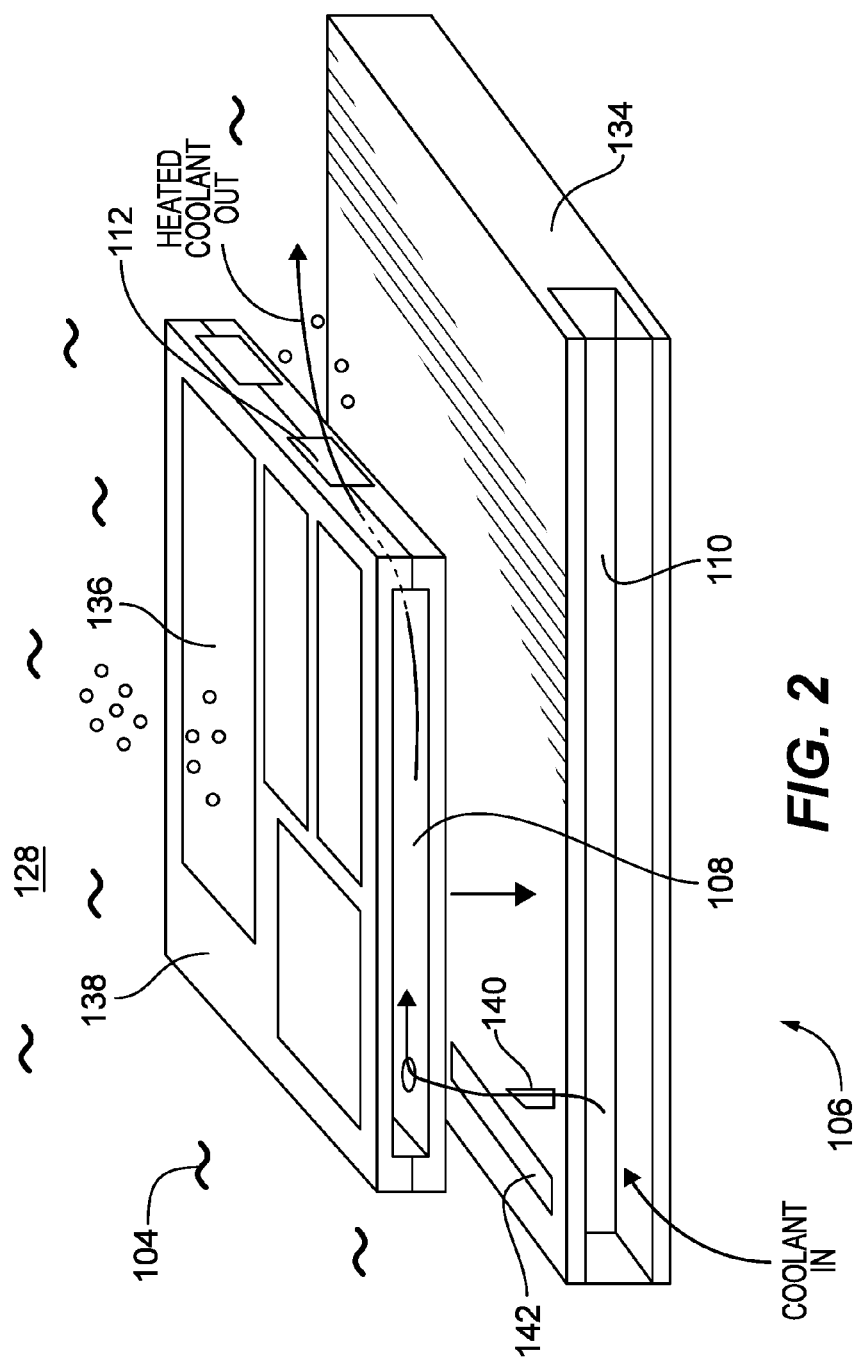
FIG. 2 is a exploded view of an embodiment of the immersion cooled electronics arrangement of FIG. 1, showing an integrated circuit connected to a printed circuit board (PCB) with the passageway in fluid communication with the PCB.

With reference to FIG. 2, electronic device 106 is shown. Electronic device 106 includes a printed circuit board (PCB) 134 and an integrated circuit 136, which may include a chip package 138. In the illustrated exemplary embodiment PCB 134 defines inlet 110 and a hypodermic needle segment 140 is fixed to PCB 134. Chip package 138 defines passageway 108 and outlet 112. Integrated circuit 136 couples to PCB 134 such that hypodermic needle segment 140 connects inlet 110 with passageway 108, inlet 110 thereby being in fluid communication with passageway 108.

Hypodermic needle segment 140 simplifies assembly of PCB 134 and integrated circuit 136 because hypodermic needle segment 140 pierces either PCB 134 or chip package 138 to fluidly couple each to the other, opening the alignment tolerance of PCB 134 and chip package 138 during assembly. Moreover, due to the immersion of electronic device 106 within fluid 104 within housing 102, there is no need to seal the aperture created by penetration of hypodermic needle 140 into chip package 138 as any leakage about aperture/hypodermic needle interface returns to the interior of housing 102. Although illustrated as fixed to PCB 134 and extending into chip package 138, it is to be appreciated and understood that hypodermic needle 140 can be fixed to chip package 138 and can extend into PCB 134.

Passageway 108 is in turn in fluid communication with outlet 112 through chip package 138 such that coolant flowing therethrough flows across heated surfaces of integrated circuit 136. Outlet 112 is in fluid communication with inlet 110 external of passageway 108 through an interior 128 of housing 102 (shown in FIG. 1). Passageway 108 may include a microchannel cooler that, in certain embodiments, provides direct access for coolant entering inlet 110 to heated surfaces within integrated circuit 136 for removing heat therefrom.

As coolant flows through inlet 110, passageway 108, and outlet 112 heat transfers between integrated circuit 136 and the flowing coolant. Operation of pump 122 (shown in FIG. 1) enables use of integrated circuit 136 at higher heat loads because coolant flowing through passageway 108 increases the rate of heat transfer between the coolant and electronic device 106. In certain embodiments, operation of pump 122 may be selective. For example, pump 122 may provide a fluid flow to inlet 110 only during time intervals when heat generation from integrated circuit 124 exceeds the capability of the immersion cooling arrangement to provide sufficient cooling, increasing efficiency of the illustrated exemplary cooling arrangement. As will be appreciated by those of skill in the art in view of the present disclosure, because inlet 110 is disposed within PCB 134, coolant provided to the electronic device 106 also cools low power elements (relative to integrated circuit 124) fixed to (or integrated in) PCB 134, such as trace 142 by way of non-limiting example.

Figure 3:
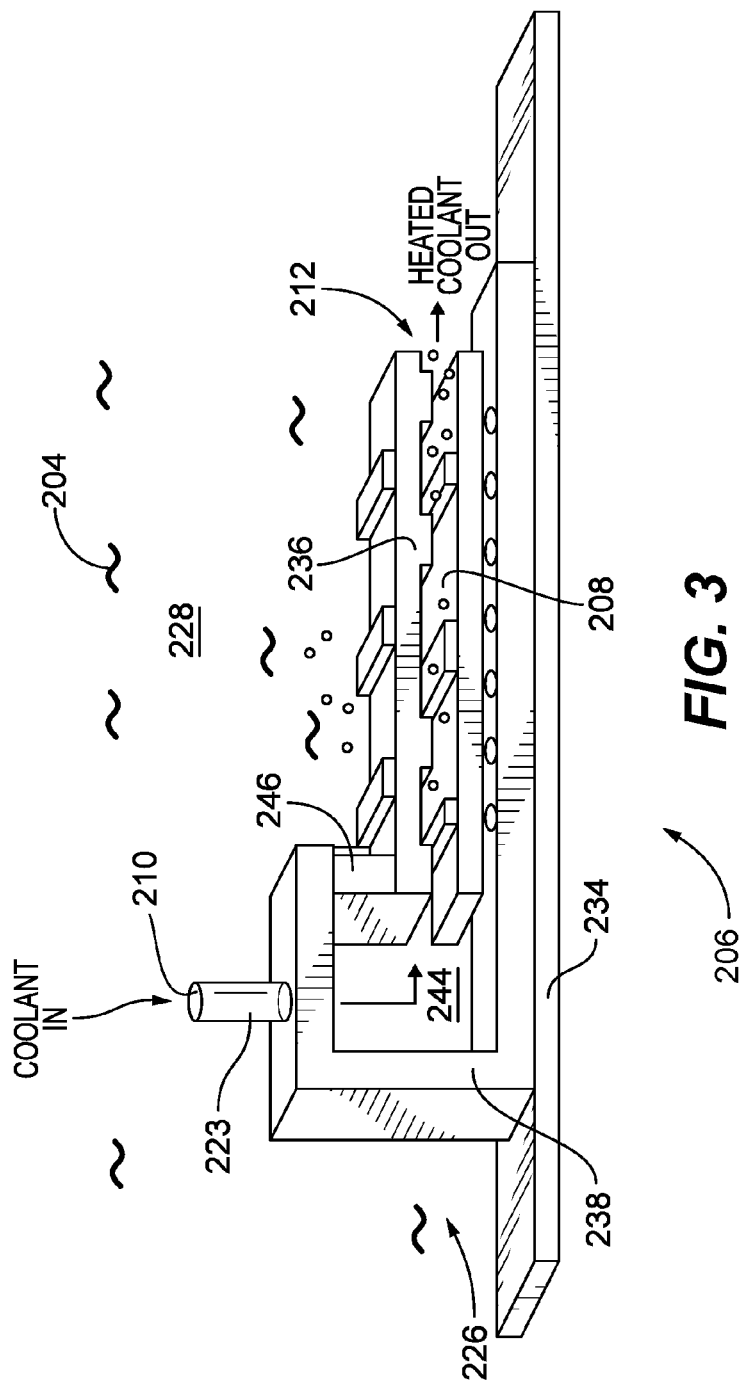
FIG. 3 is a cross-sectional view of another embodiment of the immersion cooled electronics arrangement of FIG. 1, showing an integrated circuit connected to a PCB with the passageway fluidly isolated from the PCB.

With reference to FIG. 3, a second embodiment of an electronic device 206 is shown. Electronic device 206 is similar to electronic device 106, and additionally includes an inlet 210 defined by chip package 238. A conduit 223 fluidly coupled to pump 122 (shown in FIG. 1) is in fluid communication with inlet 210. Inlet 210 is in fluid communication with a plenum 244, which is in fluid communication with passageway 208. Passageway 208 is in turn bounded by integrated circuit 236 and is fluid communication with interior 228 through outlet 212. Plenum 244 is also in fluid communication with interior 228 of housing 102 (shown in FIG. 1) through a vent 246 occupied by a porous body or small channel that is configured and adapted to allow vapor phase fluid to traverse vent 246 while resisting liquid phase fluid, reducing (or preventing) the introduction of vapor phase coolant into passageway 208. As illustrated in FIG. 3, chip package 238 may be fixed on a PCB 234.

A method of cooling an electronic device, e.g., electronic device 106 (shown in FIG. 1) includes introducing fluid, e.g., liquid phase coolant 104 (shown in FIG. 1), from an interior of a housing, e.g., housing 102 (shown in FIG. 1) into a passageway, e.g., passageway 108 (shown in FIG. 1) defined by the electronic device. The fluid is flowed through the passageway, as shown in exemplary manner by the coolant flow arrow shown in FIG. 2, and heat is transferred from the electronic device to the fluid flowing, as shown with bubbles in coolant discharged from the passageway. In certain embodiments, the method can include generating heat using the electronic device while disposed within the housing. The method can include flowing heated coolant from the passageway into the interior of the housing. The method can include pumping coolant through the passageway, e.g., using pump 122 (shown in FIG. 1).

As devices like computer chips become smaller and faster, cooling can present challenges. In embodiments described herein, a microchannel cooler is embedded within an electronic component like a chip that is itself immersed within dielectric coolant, the microchannel cooler directing a flow of coolant to one or more heat-generating surfaces of the electronic component in the immersion cooling arrangement. This simplifies the cooling arrangement of the chip by reducing or eliminating the need for supply and return conduits from the microchannel cooler to a coolant source. Hermetic sealing to the chip itself can be eliminated as the housing of the immersion cooling arrangement provides hermetic sealing for the coolant.

In certain embodiments, the electronic arrangement includes one or more of a PCB and an integrated circuit submerged within dielectric coolant in a sealed housing. This allows the dielectric coolant to boil off the heat-generating components both from surfaces bounded by the interior of the sealed housing as well as surfaces bounded by the microchannel cooler. Optionally, a pump can provide flow of dielectric coolant to the microchannel cooler, increasing the flow of coolant to the heat-generating component, thereby increasing heat transfer from the heat-generating component within the submerged environment. This provides the benefits microchannel cooler coolant delivery without added complexity of the plumbing and seal arrangements that would otherwise be necessary to realize the benefits of the arrangement because hermetic sealing of the dielectric cooling is provided by the housing, and not the microchannel to chip interface. In addition, the arrangement provides cooling to the PCB mounting the cooled chip, which otherwise would be isolated from the coolant provided to the chip.

The methods and systems of the present disclosure, as described above and shown in the drawings, provide for immersion cooled electronic devices with superior properties including simplified assembly owing to reduced need for sealing on integrated circuit devices cooled with dielectric coolant as the housing provides sealing. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An electronics cooling arrangement, comprising:
   a housing configured to contain a coolant;
   a dielectric coolant sealed within the housing; and
   an electronic device with a printed circuit board (PCB) having a chip package coupled thereto, the electronic device disposed within the housing and submerged within the coolant,
   wherein the PCB defines an inlet,
   wherein the chip package defines an outlet, wherein the PCB and the chip package define within their interiors a passageway fluidly coupling the inlet with the outlet to allow fluid flowing between the inlet and the outlet to cool the electronic device, wherein the inlet and the outlet are in fluid communication with one another externally of the passageway through an interior of the housing, wherein the outlet opens directly to the interior of the housing.

2. The electronics cooling arrangement as recited in claim 1, further including a pump in fluid communication with the passageway.

3. The electronics cooling arrangement as recited in claim 2, wherein the pump is configured to urge fluid through the passageway.

4. The electronics cooling arrangement as recited in claim 2, wherein the pump is contained within the housing.

5. The electronics cooling arrangement as recited in claim 2, further including a control module operatively connected with the pump and configured to selectively operate the pump according to heat generated by the electronic device.

6. The electronics cooling arrangement as recited in claim 1, wherein the electronic component being submerged within a liquid phase of the dielectric coolant.

7. The electronics cooling arrangement as recited in claim 1, wherein the electronic device includes an integrated circuit exposed to an interior of the housing.

8. The electronics cooling arrangement as recited in claim 1, wherein the chip package includes a microchannel cooler in fluid communication with the passageway.

9. The electronics cooling arrangement as recited in claim 1, wherein the chip package includes an integrated circuit.

10. An electronics cooling arrangement, comprising:
a housing configured to contain a coolant;
an electronic device disposed within the housing having a passageway with at least one inlet and at least one outlet, the passageway configured to allow fluid flowing between the inlet and the outlet to cool the electronic device; and
a hypodermic needle segment fluidly coupling the inlet with the passageway.

11. An immersion cooling arrangement, comprising:
a sealed housing;
a dielectric coolant disposed within the housing;
an electronic device disposed within the housing having a passageway with at least one inlet and at least one outlet, wherein the inlet is submerged within the dielectric coolant, wherein the outlet is submerged within the dielectric coolant, and wherein the inlet and the outlet are in fluid communication with one another externally of the passageway through an interior of the housing; and
a hypodermic needle segment fluidly coupling the inlet with the passageway.

12. A method of cooling an electronic device, comprising:
introducing fluid from an interior of a housing into a passageway defined by the electronic device, the electronic device including a printed circuit board (PCB) with a chip package coupled to by the PCB, wherein the coolant enters the passageway through an inlet defined by PCB,
flowing fluid through the passageway;
transferring heat from the electronic device to the fluid flowing through the passageway; and
flowing heated coolant through an outlet defined by the chip package, wherein the outlet opens directly to the interior of the housing.

13. The method of cooling an electronic device as recited in claim 12, further comprising flowing heated coolant from the passageway into the interior of the housing.

14. The method of cooling an electronic device as recited in claim 12, further comprising pumping coolant through the passageway.

* * * * *